US007852893B2

(12) United States Patent
Tanaka et al.

(10) Patent No.: US 7,852,893 B2
(45) Date of Patent: Dec. 14, 2010

(54) SEMICONDUCTOR LASER DEVICE

(75) Inventors: Akira Tanaka, Kanagawa-ken (JP); Makoto Okada, Chiba-ken (JP); Takayuki Matsuyama, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 29 days.

(21) Appl. No.: 12/035,959

(22) Filed: Feb. 22, 2008

(65) Prior Publication Data

US 2008/0205467 A1 Aug. 28, 2008

(30) Foreign Application Priority Data

Feb. 26, 2007 (JP) ............................ 2007-044955
Feb. 28, 2007 (JP) ............................ 2007-050499
Feb. 21, 2008 (JP) ............................ 2008-039912

(51) Int. Cl.
*H01S 5/00* (2006.01)

(52) U.S. Cl. ............... 372/49.01; 372/43.01; 372/45.01

(58) Field of Classification Search ............. 372/49.01, 372/43.01, 45.01
See application file for complete search history.

(56) References Cited

U.S. PATENT DOCUMENTS 6,067,310 A * 5/2000 Hashimoto et al. ....... 372/49.01
6,438,150 B1 * 8/2002 Yoo ........................ 372/49.01
6,711,194 B2 * 3/2004 Ohkubo et al. ........... 372/45.01
6,914,922 B2 7/2005 Hayashi et al.
7,187,701 B2 * 3/2007 Mihashi et al. .......... 372/46.01
2002/0094190 A1 7/2002 Katayama
2003/0026306 A1 * 2/2003 Ohkubo et al. ................ 372/43
2003/0210722 A1 * 11/2003 Arakida et al. ................ 372/49
2004/0218646 A1 * 11/2004 Mihashi et al. ............... 372/46
2005/0195875 A1 * 9/2005 Asano ......................... 372/39
2005/0201440 A1 * 9/2005 Asano ..................... 372/43.01
2006/0193359 A1 * 8/2006 Kuramoto ................ 372/45.01
2006/0203868 A1 * 9/2006 Hirata ..................... 372/43.01
2008/0181275 A1 * 7/2008 Matsuyama et al. .... 372/45.011

FOREIGN PATENT DOCUMENTS

JP 2000-216476 8/2000
JP 2002-094190 3/2002
JP 2002-237648 8/2002
JP 2005-302843 10/2005
JP 2007-095758 4/2007

* cited by examiner

*Primary Examiner*—Armando Rodriguez
*Assistant Examiner*—Phillip Nguyen
(74) *Attorney, Agent, or Firm*—Turocy & Watson, LLP

(57) ABSTRACT

A semiconductor laser device includes: a substrate of a first conductivity type; a laminated body of a nitride semiconductor provided on the substrate and including at least an active layer and a cladding layer, the cladding layer being of a second conductivity type and having a ridge-shaped waveguide; a first film provided on one end surface of an optical resonator composed of the laminated body, the first film having a reflectance of 40% or more and 60% or less; and a second film provided on the other end surface of the optical resonator and having a higher reflectance than the first film. The optical resonator has a length of 400 μm or less. The one end surface serves as a light emitting surface.

13 Claims, 10 Drawing Sheets

SEMICONDUCTOR LASER DEVICE

CROSS-REFERENCE TO RELATED APPLICATIONS

This application is based upon and claims the benefit of priorities from the prior Japanese Patent Application No. 2007-044955, filed on Feb. 26, 2007, the prior Japanese Patent Application No. 2007-050499, filed on Feb. 28, 2007, and the prior Japanese Patent Application No. 2008-039912, filed on Feb. 21, 2008; the entire contents of which are incorporated herein by reference

BACKGROUND OF THE INVENTION

1. Field of the Invention

This invention relates to a semiconductor laser device.

2. Background Art

Nitride semiconductors emitting blue-violet laser light have high melting point and high equilibrium vapor pressure of nitrogen, interfering with their bulk crystal growth from melt. Hence it is difficult to use a large-diameter GaN substrate for epitaxial growth of a nitride semiconductor laminated body including a light emitting layer, resulting in a low yield of semiconductor laser chips per wafer. Chip downsizing is required for increasing the chip yield. However, simply decreasing the optical resonator length results in increased current density and is likely to cause degradation due to heat generation. Hence reduction of current density including reduction of threshold current is required.

JP 2002-094190A discloses a technique concerning a nitride semiconductor light emitting device in which the threshold current is reduced by effectively confining light in the light emitting layer. In this technique, the threshold current is reduced by setting the thickness of the p-type cladding layer to less than 0.3 μm, thereby cutting off higher order modes in the vertical transverse mode.

SUMMARY OF THE INVENTION

According to an aspect of the invention, there is provided a semiconductor laser device including: a substrate of a first conductivity type; a laminated body of a nitride semiconductor provided on the substrate and Including at least an active layer and a cladding layer, the cladding layer being of a second conductivity type and having a ridge-shaped waveguide; a first film provided on one end surface of an optical resonator composed of the laminated body, the first film having a reflectance of 40% or more and 60% or less; and a second film provided on the other end surface of the optical resonator and having a higher reflectance than the first film, the optical resonator having a length of 400 μm or less, and the one end surface serving as a light emitting surface.

According to another aspect of the invention, there is provided a semiconductor laser device including: a laminated body of a nitride semiconductor including an active layer; and a first dielectric of silicon nitride provided in contact with a light emitting surface of an optical resonator composed of the laminated body, the first dielectric having a thickness of not less than in-medium wavelength.

According to another aspect of the invention, there is provided a semiconductor laser device including: a substrate of a first conductivity type; a laminated body of a nitride semiconductor provided on the substrate and including at least an active layer and a cladding layer, the cladding layer being of a second conductivity type and having a ridge-shaped waveguide; and a first film including silicon nitride and provided in contact with a light emitting surface of an optical resonator composed of the laminated body, wherein the optical resonator has a length of 400 μm or less, the silicon nitride has a thickness of not less than in-medium wavelength, and the first film has a reflectance of 40% or more and 60% or less at a wavelength of light emitted from the active layer.

BRIEF DESCRIPTION OF THE DRAWINGS

FIG. 5A shows the wavelength dependence of the reflectance (%) for wavelength of 390 to 420 nm, and FIG. 5B shows the reflectance at distance × (nm) from the light emitting surface 70

DETAILED DESCRIPTION OF THE INVENTION

Figure 1A:
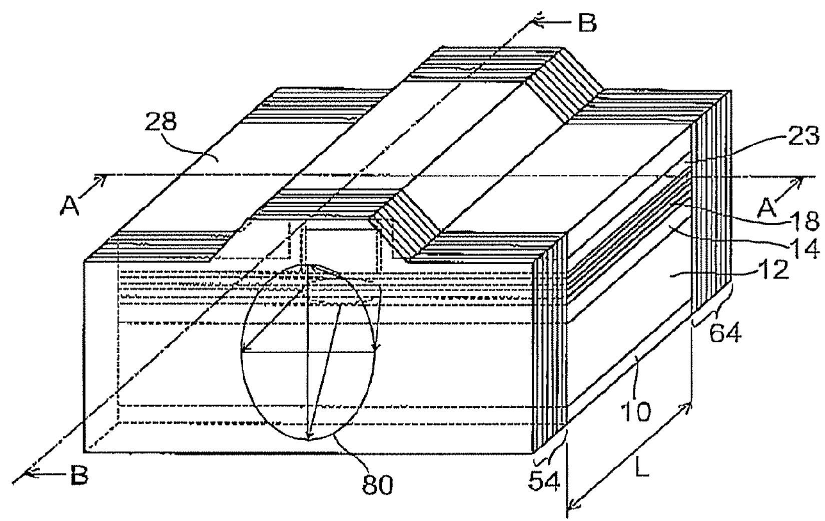
FIG. 1A is a schematic perspective view, FIG, 1B is a schematic cross-sectional view taken along line A-A.
Figure 1B:
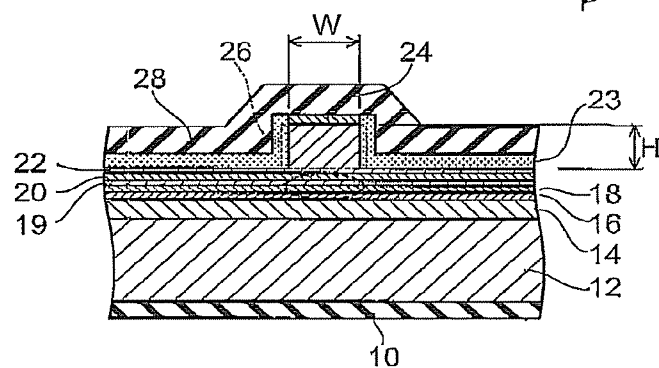
FIG. 1C is a schematic cross-sectional view taken along line B-B.

Embodiments of the invention will now be described with reference to the drawings. FIG. 1 shows a semiconductor laser device according to a first embodiment of the invention, where FIG. 1A is a schematic perspective view, FIG. 1B is a schematic cross-sectional view taken along line A-A, and FIG. 5C is a schematic cross-sectional view taken along line B-B. An n-type AlGaN cladding layer 14, an n-type GaN optical guide layer 16, an active layer 18, an overflow prevention layer 19 of $p^+$-type AlGaN, a p-type GaN optical guide layer 20, a p-type AlGaN cladding layer 22, and a $p^+$-type GaN contact layer 24 are epitaxially grown in this order on an n-type GaN substrate 12. This nitride semiconductor laminated body can be formed by MOCVD (metal organic chemical vapor deposition) or MBE (molecular beam epitaxy), for example.

The term "nitride semiconductor" used herein refers to a semiconductor represented by $(Al_xB_{1-x})_yGa_zIn_{1-y-z}N$ ($0\leqq x\leqq 1$, $0<y<1$, $0<z<1$, $y+z\leqq 1$), and also encompasses those containing As and/or P as group V elements and those containing p-type or n-type impurities.

The $p^+$-type GaN contact layer 24 and the p-type AlGaN cladding layer 22 are shaped into a striped ridge halfway down through the p-type AlGaN cladding layer 22, and an insulating film 23 of $SiO_2$ is formed to cover the surface other than the top of the ridge. The ridge includes a waveguide 26 derived from the p-type AlGaN cladding layer 22 having width W and height H, and the $p^+$-type GaN contact layer 24 having the same width W.

A p-side electrode 28 is provided on the top of the $p^+$-type GaN contact layer 24, and an n-side electrode 10 is provided on the bottom of the n-type GaN substrate 12. The p-side electrode 28 can be a monolayer, lamination, or alloy of Pt, Pd, Ni, and/or Au. The n-side electrode 10 can be a monolayer, lamination, or alloy of Ti, Pt, Au, and/or Al.

An optical resonator is formed by cleavage at a surface perpendicular to the extending direction of the stripe. By cleavage, a mirror-like surface appears at the end surface of the nitride semiconductor laminated body, realizing an optical resonator. This structure is a semiconductor laser device of the so-called real-index waveguide structure in which optical confinement in the horizontal transverse direction is controlled by the waveguide 26.

The light emitting surface 70 of the optical resonator is provided with a first film 54 in which two types of dielectric films having different refractive indices are alternately laminated. The sum of the thicknesses of the pair of dielectric films is a length equivalent to a half wavelength per pair, thereby realizing a Bragg reflector in which the reflected light beams constructively interfere with each other. The in-medium wavelength of the dielectric, $\lambda_g$, is reduced to $\lambda_0/n$ (where $\lambda_0$ is an emission wavelength of a light from the active layer 18 in a vacuum and n is the refractive index). Hence the thickness of each dielectric is determined so that the sum of the two thicknesses divided by the in-medium wavelength is one half.

In this embodiment, the reflectance of the first film 54 on the light emitting surface 70 is 40% or more and 60% or less. The light beam 80 passes through the light emitting surface 70 and the first film 54 and then is divergently emitted. A second film 64 is formed on a light reflecting surface 72 opposite to the light emitting surface 70 and has a reflectance higher than 60%. That is, the second film 64 is a high-reflective film, more reflective than the first film 54.

Figure 1C:
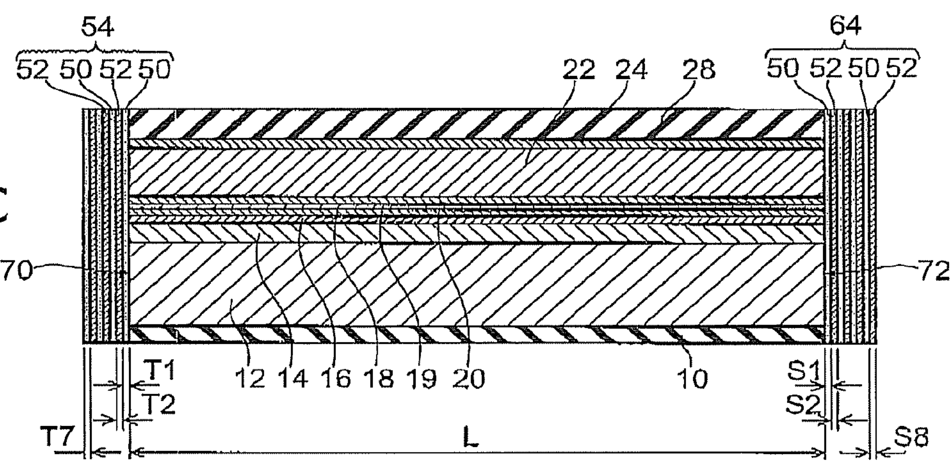

In this case, for example, from the active layer 18 side in FIG. 1C, dielectric films of silicon nitride and oxide are alternately formed. The silicon nitride 50 is SiN or $Si_3N_4$. The oxide 52 is $SiO_2$, $Al_2O_3$, $ZrO_2$, or $TiO_2$. In the case where the thicknesses of the silicon nitride and $SiO_2$ are both set to a quarter wavelength, a Bragg reflector can be realized when the thicknesses T1 and T2 are 51 and 68 nm, respectively, because the refractive indices of silicon nitride and $SiO_2$ are approximately 2.0 and approximately 1.5, respectively.

FIG. 1C shows an example of a total of seven layers. The thickness T7 of the outermost silicon nitride is varied to adjust the reflectance of the first film 54. In the case of a semiconductor laser device in the wavelength range of 400 to 410 nm, the reflectance in the range of 40 to 60% can be achieved by the structure as shown in FIG. 1C.

The reflectance of the second film 64 is made higher than that of the first film 54 so that the optical output from the light emitting surface 70 is increased. For example, the reflectance of the second film 64 is preferably 90% or more using eight or more layers, and more preferably 95% or more using still more layers. FIG. 1C shows an example of eight layers. From the light reflecting surface 72 side, silicon nitride 50 having thickness S1 and $SiO_2$ 52 having thickness S2 are alternately laminated with a quarter wavelength thickness, and the thickness 58 of the outermost $SiO_2$ 52 is varied to adjust the reflectance of the second film 64.

Figure 2:
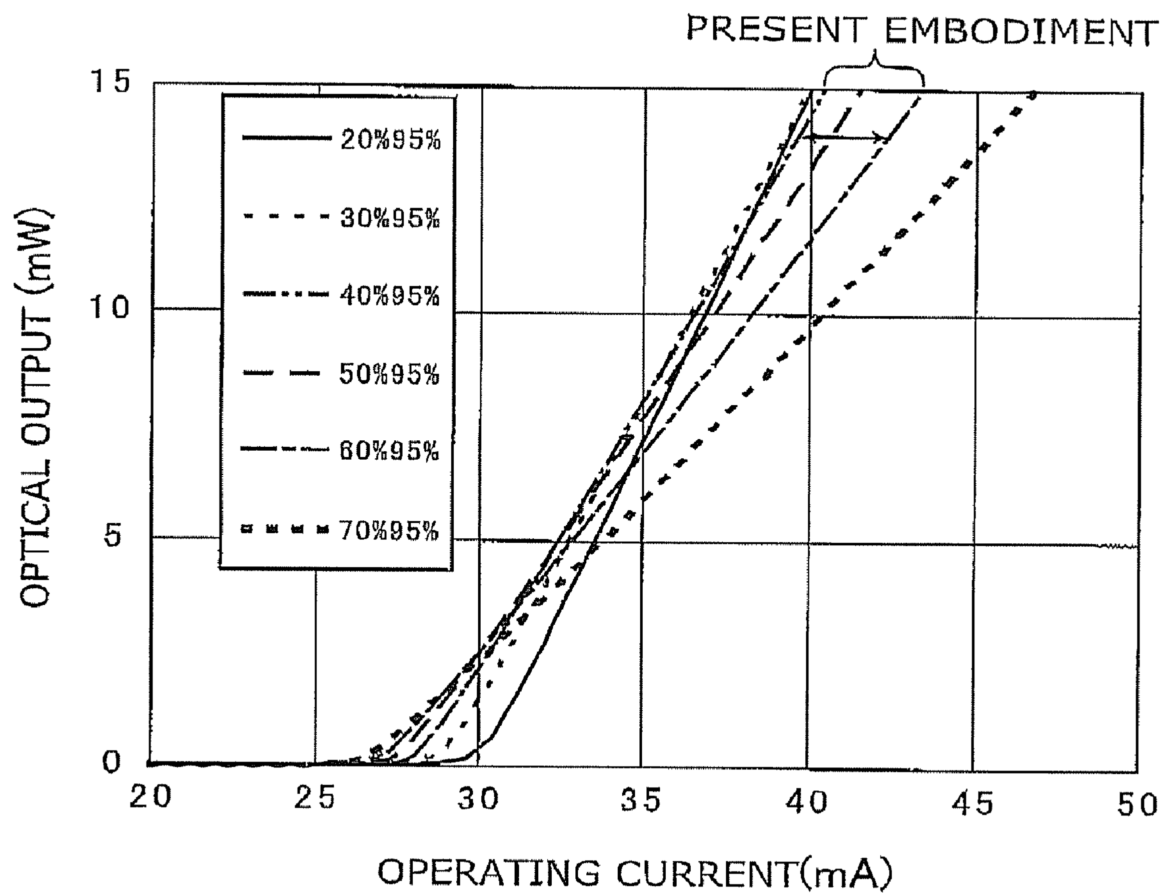
FIG. 2 is a graph showing the simulated current dependence of optical output of a semiconductor laser device according to this embodiment.

FIG. 2 is a graph showing the simulated current dependence of optical output of a semiconductor laser device according to this embodiment. In FIG. 2, the vertical axis represents optical output (mW) from the light emitting surface 70, and the horizontal axis represents operating current (mA). The reflectance of the first film 54 is varied as 20, 30, 40, 50, 60, and 70%. The optical resonator length L is 400 μm, and the reflectance of the second film 64 is 95%. The threshold current is approximately 29 mA for a reflectance of 20%, and decreases to approximately 27.5 mA for 40% and approximately 26.5 mA for 60%, where it is nearly saturated.

On the other hand, the current corresponding to an optical output of 15 mW is approximately 40 mA for a reflectance of 20%, increases to approximately 40.2 mA for 40% and approximately 43 mA for 60%, and more sharply increases to approximately 46.5 mA for 70%.

As seen from FIG. 2, a low reflectance is preferable for decreasing the operating current at an output of 15 mW, but a high reflectance is preferable for decreasing the threshold current. It can be also understood from this figure that heat generation varies with reflectance.

Figure 3:
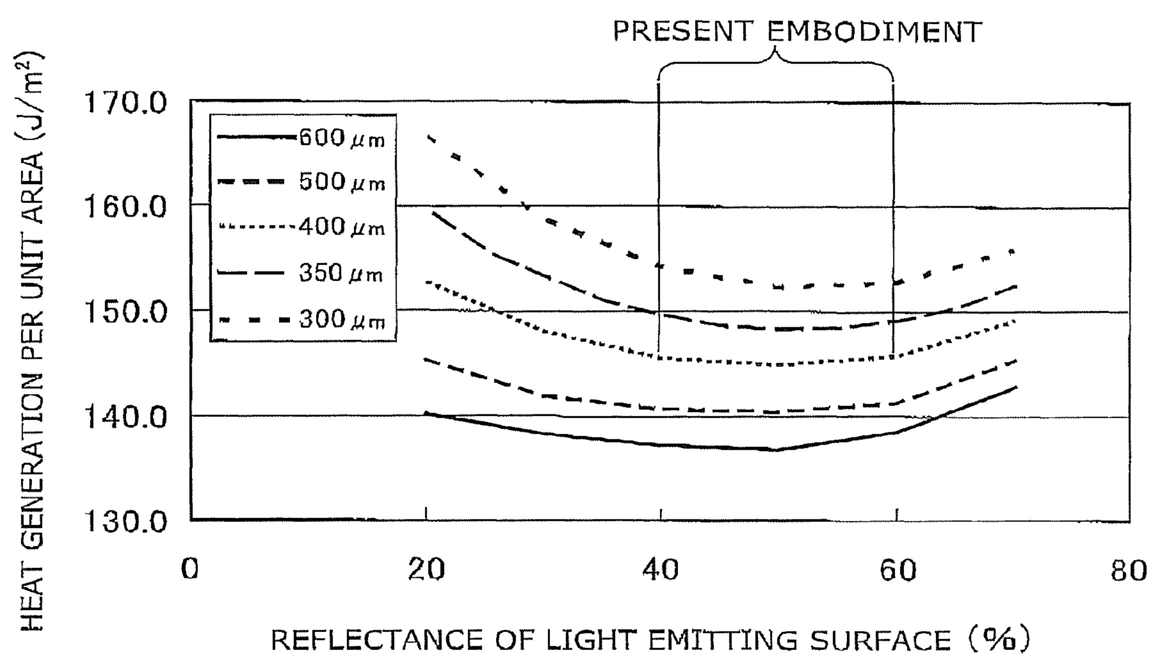
FIG. 3 is a graph showing the simulated reflectance dependence of heat generation.

FIG. 3 is a graph showing the simulated reflectance dependence of heat generation.

In this figure, the vertical axis represents heat generation per unit area ($j/m^2$) at an optical output of 10 mW, and the horizontal axis represents reflectance (%). The optical resonator length L is varied as 300, 350, 400, 500, and 600 μm. The heat generation in FIG. 3 is determined by simulation from the amount of electrical energy consumed in the population inversion until lasing and from Joule heat generation in the waveguide 26.

As the optical resonator length L decreases, the reflectance dependence increases. The heat generation steeply increases when the reflectance is lower than 40% or higher than 60%. Hence the reflectance is preferably in the range of 40 to 60%. In particular, when the optical resonator length L is 400 μm, the heat generation can be generally minimized to 144.9 $J/m^2$ for a reflectance of 45 to 55%. The commonly-used light emitting surface 70 has a reflectance of 20% or less, and the heat generation is 145.3 $J/m^2$ when L is 500 μm and the reflectance is 20%. Hence this embodiment achieves a lower heat generation. Thus L can be reduced by 20%, that is, the chip yield can be increased by 25%, while maintaining reliability. Furthermore, when the optical resonator length L is 350 μm, the heat generation can be generally minimized to 148.1 $J/m^2$ for a reflectance of 45 to 55%. This heat generation is lower than that obtained when L is 500 μm and the reflectance is 10%. Thus L can be reduced by 30%, that is, the chip yield can be increased by 43%, while maintaining reliability.

When the optical resonator length L is 300 μm, the heat generation can be generally minimized to 152.3 $J/m^2$ for a reflectance of 50 to 55%. Thus the reflectance of the first film 54 is preferably 40% or more and 60% or less, and more preferably 45% or more and 55% or less. In this embodiment, the light reflectance of the light emitting surface 70 is controlled in the range of 40 to 60% to reduce the threshold current and heat generation.

In contrast, in a comparative example in which a reflecting film having a reflectance of 20% or less is used for increasing the optical output from the light emitting surface 70, simply decreasing the optical resonator length to downsize the chip results in increased heat generation per unit area. For example, when the optical resonator length is 300 μm, the heat generation for a reflectance of 20% is 166.6 $J/m^2$, which is approximately 109% of the minimum. The heat generation further increases when the reflectance is decreased to approximately 5% for rewriting purposes. That is, decreasing the optical resonator length with the reflectance kept low may result in decreased reliability.

In an optical pickup dedicated to reproduction for the next-generation DVD, the maximum rated optical output of a semiconductor laser device is 15 mW. In FIG. 2, when the reflectance is 40% or more and 60% or less, an output of 15 mW can be realized at a low operating current of approximately 43 mA or less. While it is possible to increase the optical output by increasing the operating current, low current operation is more preferable for operating an optical pickup with low power consumption.

FIG. 3 also indicates that the heat generation increases with the decrease of the optical resonator length L. For example, when the optical resonator length L is less than 300 μm, the heat generation per unit area is higher than 152.3 $J/m^2$ even if the reflectance is in the range of 40% or more and 60% or less. In this case, the optical resonator length L is suitably determined depending on the allowable range of heat generation. More specifically, in the case where the optical system coupling efficiency of the optical pickup can be increased, the rated optical output may be lower than 15 mW, and the reliability can be ensured even if the optical resonator length L is shorter than 300 μm.

Furthermore, as shown in FIG. 2, with the increase of optical output, the operating current begins to sharply increase with the increase of reflectance, and the heat generation also begins to sharply increase. Hence, even if the reflectance is 40% or more and 60% or less, it is preferable to use the device at an optical output of 15 mW or less.

Here, the cross-sectional structure shown in FIG. 1B is described in more detail. The thickness of the n-type $Al_xGa_{1-x}N$ ($0 \leqq x \leqq 0.1$) cladding layer 14 is illustratively 1.5 μm, and the thickness of the n-type GaN optical guide layer 16 is illustratively 0.07 μm. The active layer 18 has a single or multiple quantum well structure composed of a well layer of $In_wGa_{1-w}N$ ($0.06 \leqq w \leqq 0.2$) and a barrier layer of $In_bGa_{1-b}N$ ($0.01 \leqq b \leqq 0.05$). The quantum well structure facilitates confining carriers within the well, thereby improving the emission efficiency and reducing heat generation.

The thickness of the p-type GaN optical guide layer 20 is Illustratively 0.03 μm, and the height H of the waveguide 26 of $Al_yGa_{1-y}N$ ($0 \leqq y \leqq 0.1$) in the p-type AlGaN cladding layer 22 is illustratively 0.45 μm. The thickness of the $p^+$-type GaN contact layer 24 is illustratively 0.1 μm.

The overflow prevention layer 19 provided between the active layer 18 and the p-type GaN optical guide layer 20 is made of $Al_zGa_{1-z}N$ ($y<z$), and its thickness is illustratively 0.01 μm. If recombinations in the active layer 18 occur less frequently due to large carrier overflow, it is difficult to reduce the threshold current and heat generation. In this embodiment, the reflectance is set to 40% or more and 60% or less to reduce the threshold. Hence it is preferable to efficiently confine carriers within the active layer 18 by the overflow prevention layer 19.

For example, if the aluminum composition ratio z in the overflow prevention layer 19 is set to approximately 0.2, which is greater than the composition ratio y in the p-type AlGaN cladding layer 22, then the bandgap can be increased, and the carrier leakage can be reduced. Furthermore, the p-type acceptor concentration is set to $1 \times 10^{20}$ $cm^{-3}$ or more, for example, to increase the heterobarrier of the interface of the active layer 18 on the conduction band side. Thus, advantageously, the overflow of electrons can be further suppressed.

Furthermore, when the optical output is 15 mW or less, the current distribution can be easily made uniform, and the generation of higher order modes in the transverse mode is suppressed. Consequently, In contrast to the case where the optical output is 100 mW or more, kinks occur less frequently. Hence the width W of the waveguide 26 can be as wide as 1.5 to 2.5 μm.

According to this embodiment, the operating current at an optical output of 15 mW can be decreased, achieving reduced power consumption and downsizing of the semiconductor laser driving circuit of an optical pickup. Furthermore, it is possible to decrease the optical resonator length L while reducing heat generation. That is, it is possible to downsize the chip while maintaining reliability. Hence the chip yield can be increased even if a GaN substrate is used, although its wafer size is difficult to increase. In particular, it is easier to respond to the expanding applications of the next-generation DVD for reproduction purposes. For example, the application expands to reproduction purposes in HDTV (high definition television) video recording, computer mass storage, and amusements.

Figure 4:
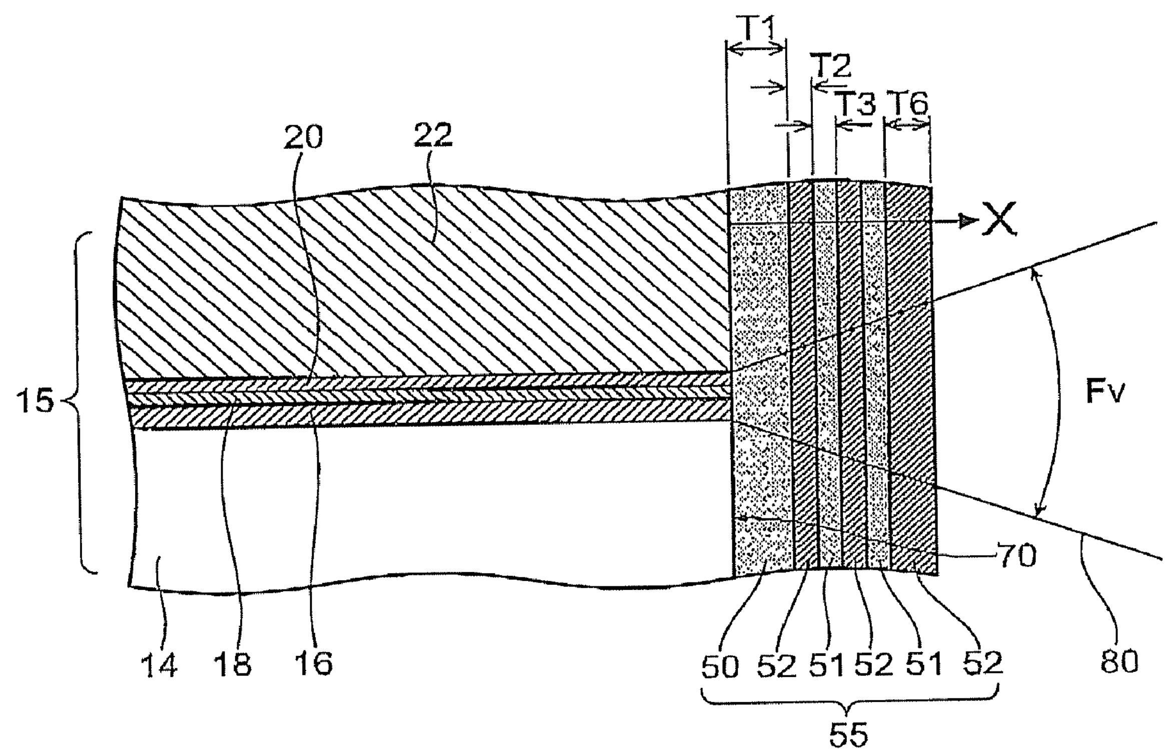
FIG. 4 is a schematic cross-sectional view in which the neighborhood of the emission point of the light emitting surface 70 is enlarged for illustrating a second embodiment of the invention.

FIG. 4 is a schematic cross-sectional view in which the neighborhood of the emission point of the light emitting surface 70 is enlarged for Illustrating a second embodiment of the invention. The n-type GaN optical guide layer 16 and the p-type GaN optical guide layer 20 are provided on either side of the active layer 18 having a single or multiple quantum well structure so that the light from the thin active layer 18 is spread vertically with respect to the active layer 18. For example, the thickness of the n-type GaN optical guide layer 16 is illustratively 70 nm, and the thickness of the p-type GaN optical guide layer 20 is illustratively 30 nm.

In this embodiment, a first dielectric made of silicon nitride 50 is provided in contact with the light emitting surface 70. The thickness T1 of the silicon nitride 50 is one wavelength or more of its in-medium wavelength ($\lambda_{g1}$). If the refractive index of the silicon nitride is 2.08 and the emission wavelength of the nitride semiconductor laser device is 405 nm, then $\lambda_{g1}$ is 194 nm, and hence T1 is 194 nm or more.

On the first dielectric made of the silicon nitride 50, an oxide layer 52 serving as a second dielectric and a silicon nitride layer 51 serving as a third dielectric are alternately laminated to constitute a Bragg reflector allowing the reflecting waves to constructively interfere with each other. In FIG. 4, two pairs of the oxide 52 and the silicon nitride 51 having a quarter wavelength thickness are laminated. If the oxide 52 is silicon dioxide having a refractive index of 1.5, its in-medium wavelength $\lambda_{g2}$ at 405 nm is 270 nm. Hence the quarter wavelength is equivalent to 68 nm for the thickness T2 of the oxide 52 and to 49 nm for the thickness T3 of the silicon nitride 51. This pair is used to construct two Bragg reflectors.

Even in a Bragg reflector in which the sum of the thicknesses (T2+T3) of the oxide 52 and the silicon nitride 51 corresponds to a half wavelength, the 180-degree phase change due to the optical path difference between the reflecting waves is added to the 180-degree phase change at the boundary surface from low index to high index so that the reflecting wave fronts at the boundary surfaces can be made in phase with each other to increase the reflectance.

If the thickness T6 of the outermost oxide 52 is $\lambda_{g2}/3$ and $\lambda_{g2}/2$, the reflectance can be set to 40% and 50%, respectively. Thus the overall reflectance of the first film (reflecting layer) 55 can be controlled by the thickness of the outermost dielectric. By varying the reflectance on the light emitting surface 70 side, the threshold current is reduced, the heat generation per unit area is suppressed, and the reliability can be improved.

Here, a description is given of the relationship between the thickness and the reflectance of the silicon nitride 50 in the first layer. In the structure of FIG. 4, the thickness of the silicon nitride 50 is varied as $\lambda_{g1}/4$, $3\lambda_{g1}/4$, and $7\lambda_{g1}/4$. The second layer is silicon dioxide 52 having a thickness of $\lambda_{g2}/4$, the third layer is silicon nitride 51 having a thickness of $\lambda_{g1}/4$, the fourth layer is silicon dioxide 52 having a thickness of $\lambda_{g2}/4$, the fifth layer is silicon nitride 51 having a thickness of $\lambda_{g1}/4$, and the sixth layer is silicon dioxide 52 having a thickness of $\lambda_{g2}/4$. The reflectance of the second film 64 on the light reflecting surface 72 side is set to 90% or more, but the invention is not limited thereto.

Figure 5A:
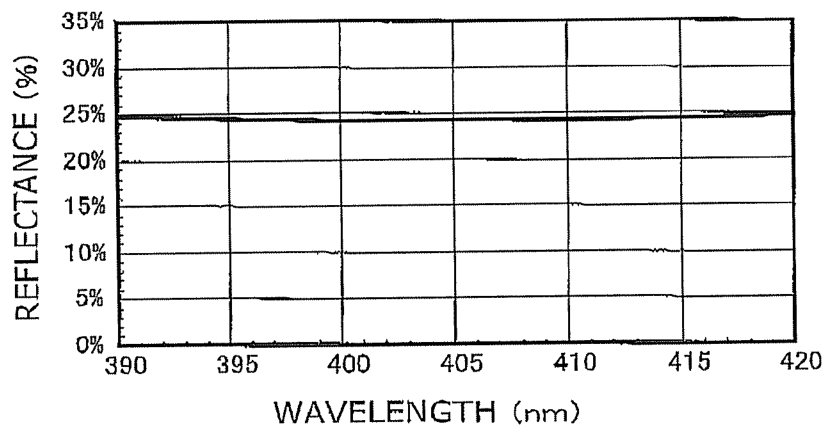
FIGS. 5A and 5B include graphs showing the reflectance in the six-layered first film 55 including the silicon nitride 50 having a thickness of $\lambda_{g1}/4$, where
Figure 5B:
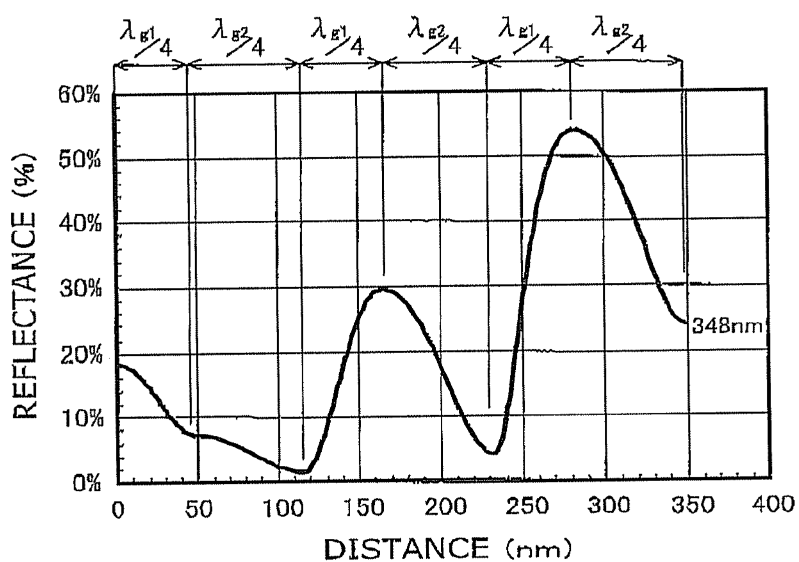

FIG. 5 includes graphs showing the reflectance in the six-layered first film 55 including the silicon nitride 50 having a thickness of $\lambda_{g1}/4$, where FIG. 5A shows the wavelength dependence of the reflectance (%) for wavelength of 390 to 420 nm, and FIG. 5B shows the reflectance at distance X (nm) from the light emitting surface 70. The configuration of FIG. 5 includes a Bragg reflector in which silicon nitride and silicon dioxide are alternately laminated with a quarter wavelength thickness. The six layers of the first film 55 have a total thickness of 348 nm. While the refractive index of the nitride semiconductor laminated body 15 may be 2.5 to 2.7, the simulation of reflectance is performed herein by assuming that it is 2.5.

If the laminated body 15 is in direct contact with air without the intermediary of the dielectric, the reflectance is approximately 18%, decreases with the distance X in the first and second layer, and is minimized to approximately 2% at the boundary surface between the second layer and the third layer. The reflectance is maximized to approximately 30% at the boundary surface between the third layer and the fourth layer, and again maximized to approximately 53% at the boundary surface between the fourth layer and the fifth layer. Hence, as shown in FIG. 5B, the reflectance ranging from 2 to 53% can be realized.

Figure 6A:
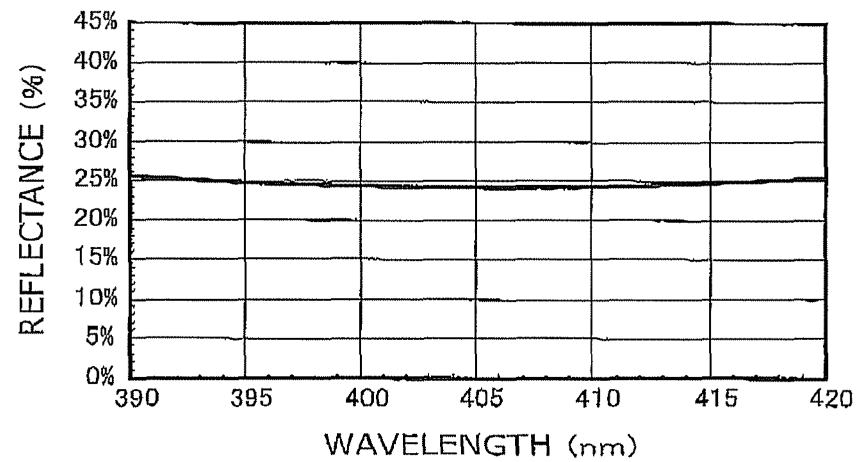
FIGS. 6A and 6B include graphs showing the reflectance in the six-layered first film 55 including the silicon nitride 50 having a thickness of $3\lambda_{g1}/4$.
Figure 6B:
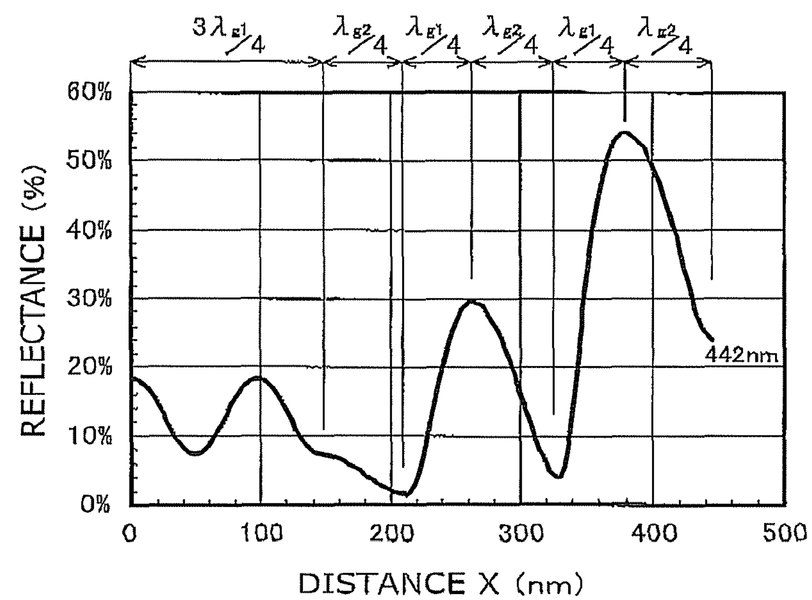

FIG. 6 includes graphs showing the reflectance in the six-layered first film 55. Including the silicon nitride 50 having a thickness of $3\lambda_{g1}/4$. The six layers of the first film 55 have a total thickness of 442 nm. As shown in FIG. 6B, two maximal points with a reflectance of approximately 18% occur in the thickness $3\lambda_{g1}/2$, and the reflectance ranging from 2 to 53% can be realized.

Figure 7A:
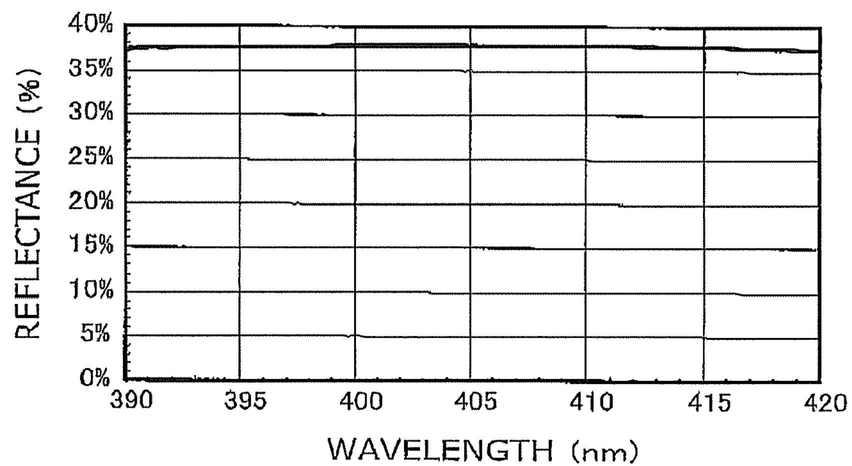
FIGS. 7A and 7B include graphs showing the reflectance in the six-layered first film 55 including the silicon nitride 50 having a thickness of $\lambda_{g1}$.
Figure 7B:
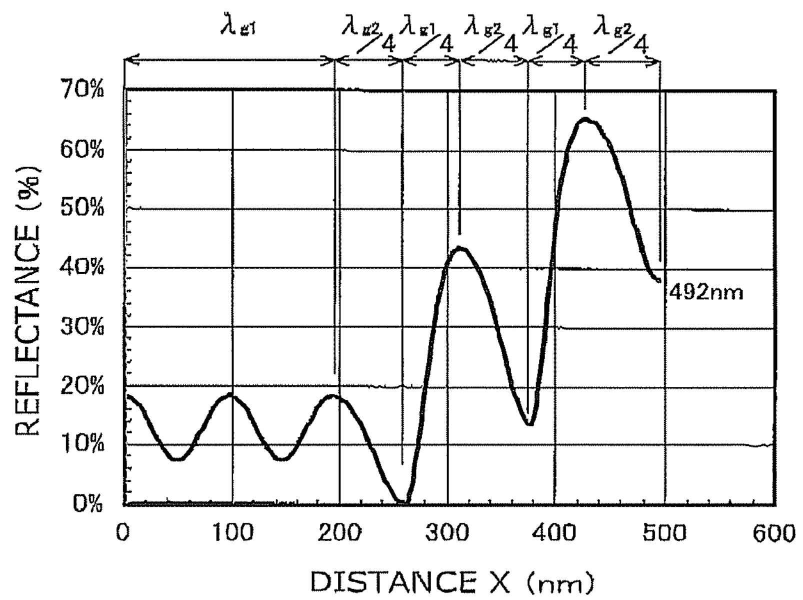

FIG. 7 includes graphs showing the reflectance in the six-layered first film 55 including the silicon nitride 50 having a thickness of $\lambda_{g1}$. The six layers of the first film 55 have a total thickness of 492 nm. As shown in FIG. 7B, three maximal points with a reflectance of approximately 18% occur in the thickness $\lambda_{g1}$, and the reflectance ranging from 0 to 65% can be realized. In this case, the sum of the thicknesses up to the fifth layer divided by the associated in-medium wavelength is 2. The reflectance can be adjusted in the range of 38 to 65% by setting the thickness of the sixth layer to be greater than zero and not greater than $\lambda_{g2}/4$.

Figure 8A:
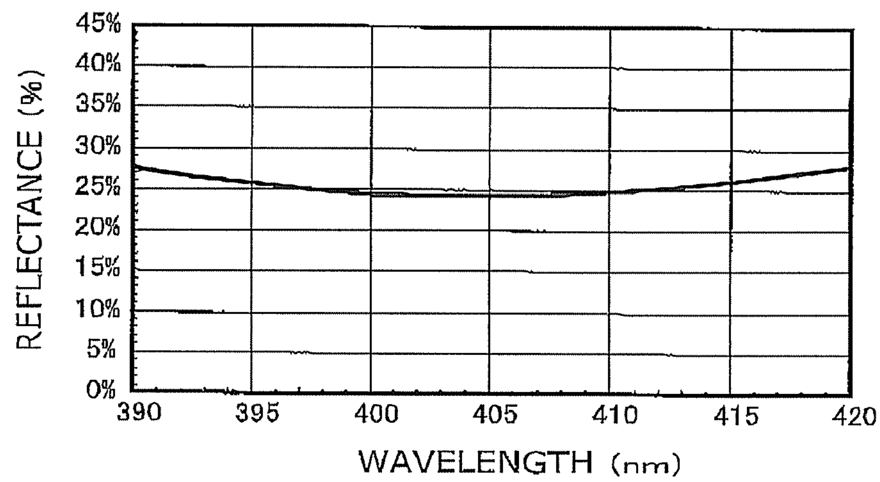
FIGS. 8A and 8B include graphs showing the reflectance in the six-layered first film 55 including the silicon nitride 50 having a thickness of $7\lambda_{g1}/4$.
Figure 8B:
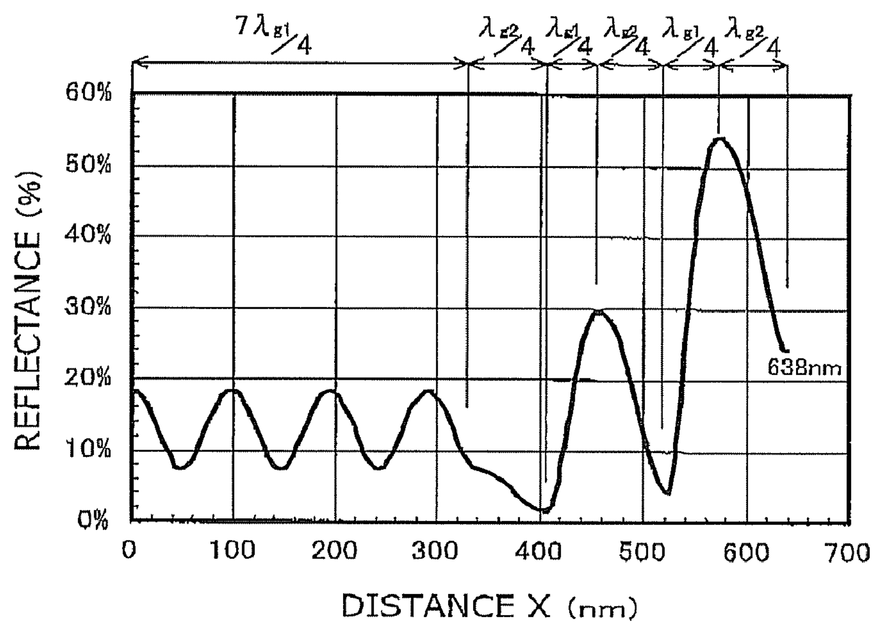

FIG. 8 includes graphs showing the reflectance in the six-layered first film 55 including the silicon nitride 50 having a thickness of $7\lambda_{g1}/4$. The six layers of the first film 55 have a total thickness of 638 nm. As shown in FIG. 8B, four maximal points with a reflectance of approximately 180% occur. In the thickness $7\lambda_{g1}/4$, and the reflectance ranging from 2 to 54% can be realized. Furthermore, as shown in FIGS. 7A and 8A, the reflectance variation can be made small with respect to the wavelength variation in the range of 390 to 420 nm even if the thickness of the silicon nitride 50 serving as the first dielectric is as thick as $\lambda_{g1}$ or more.

Here, the film formation time can be decreased as the film becomes thinner. Hence, to obtain a desired reflectance, the silicon nitride 50 is typically thinned as shown in FIG. 5B or 6B. However, if the first film 55 is thinned in a nitride semiconductor laser device, its reliability may be insufficient.

Figure 9:
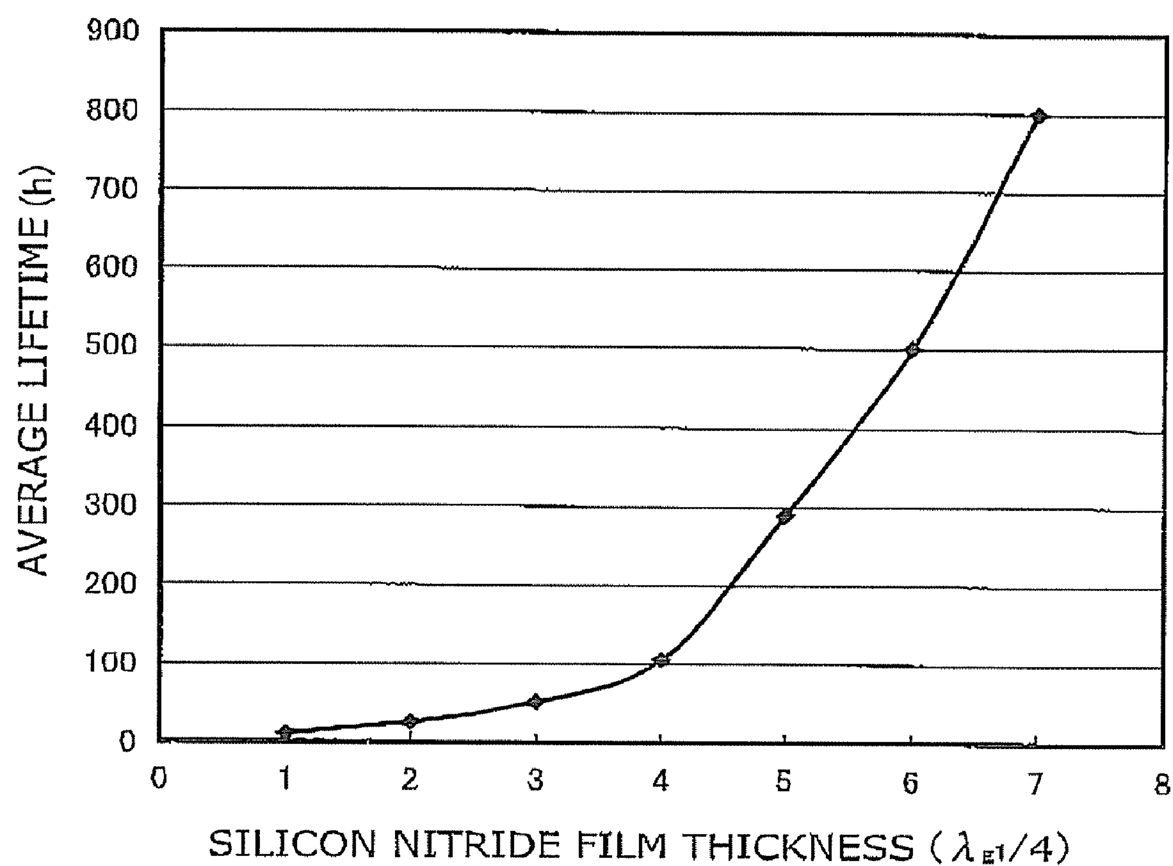
FIG. 9 illustrates the average lifetime.

FIG. 9 illustrates the average lifetime. The lifetime is defined as the time in the high-temperature power-on test until the operating current for maintaining a constant optical output of the semiconductor laser device reaches 130% of the initial value. In this Figure, the vertical axis represents the average lifetime for all the determined lifetimes. The horizontal axis represents the thickness of the nitride layer 50 normalized by $\lambda_{g1}/4$. When the thickness of the silicon nitride layer 50 is $(\lambda_{g1}/4)\times 4$, the average lifetime is approximately 100 hours. The average lifetime is improved as the thickness increases. However, when the thickness of the silicon nitride 50 is less than $\lambda_{g1}$, degradation proceeds rapidly.

Figure 10A:
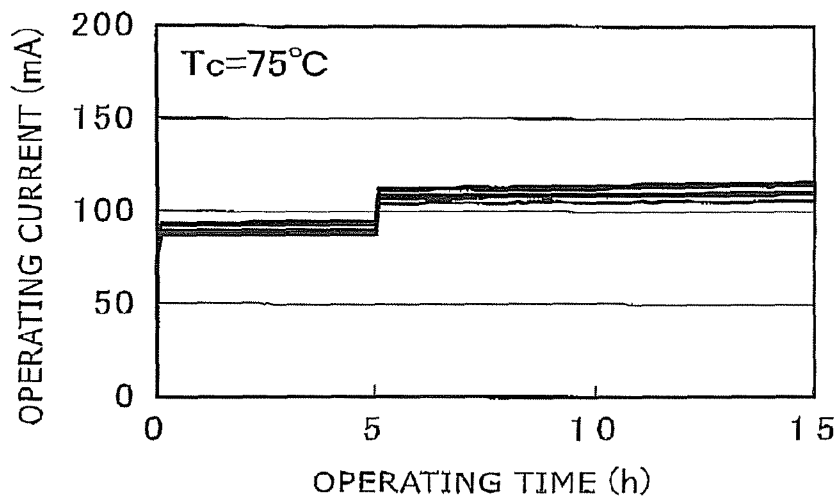
FIG. 10 shows the operating current in the high-temperature power-on test, where FIGS. 10A and 10B correspond to the second embodiment and the comparative example, respectively.
Figure 10B:
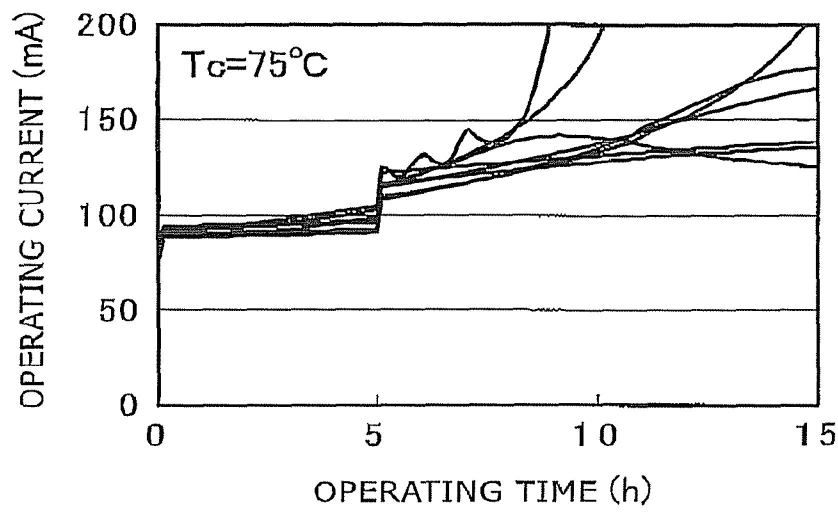

FIG. 10 shows the operating current in the high-temperature power-on test, where FIGS. 10A and 10B correspond to the second embodiment and the comparative example, respectively. The vertical axis represents operating current (mA), and the horizontal axis represents power-on time (h). The casing temperature (Tc) is 75° C. The optical output is 50 mW during 0 to 5 hours, and 80 mW after 5 hours. The reflectance is approximately 7%. In the first film 55 of this embodiment, the thickness of the silicon nitride 50 is $7\lambda_{g1}/4$, and silicon dioxide is provided thereon with a thickness of $\lambda_{g2}/2$.

In the comparative example, the thickness of silicon nitride is $3\lambda_{g1}/4$, and silicon dioxide is provided thereon with a thickness of $0.04\lambda_{g2}$.

In the comparative example, the operating current gradually increases, and the average lifetime is approximately 60 hours, which is insufficient for the next-generation DVD. In contrast, in the second embodiment, the variation of operating current is small, and the average lifetime is approximately 800 hours (Tc=75° C.), which is suitable for the next-generation DVD.

In the second embodiment, the structure of FIG. 1 is used, where the thickness T1 of the silicon nitride 50 is $\lambda_{g1}$ or more. That is, it corresponds to the reflectance shown in FIGS. 7 and 8. Furthermore, if a Bragg reflector is provided on the silicon nitride 50, the reflectance can be made higher than approximately 18%, which is obtained in the case where the light emitting surface 70 is in contact with air. Thus the threshold current can be reduced. Hence the heat generation per unit area can be reduced, and the reliability can be further enhanced.

The silicon nitride 50 is provided in contact with the light emitting surface 70. Silicon nitride has a linear expansion coefficient of approximately $3.2\times10^{-6}$/° C., which is close to that of GaN, $3.17\times10^{-6}$/° C. In contrast, silicon dioxide and aluminum oxide have a linear expansion coefficient of $7.0\times10^{-6}$/° C. and $6.7\times10^{-6}$/° C., respectively. That is, the linear expansion coefficient of oxides is as large as twice or more that of GaN. Hence the boundary between the silicon nitride 50 and the light emitting surface 70 is physically stable against expansion and shrinkage in the manufacturing process and the operating condition, allowing prevention of peeling and distortion. Furthermore, as the silicon nitride 50 becomes thicker, the spacing between the oxide 52 having a large linear expansion coefficient and the light emitting surface 70 can be expanded, and the interface between the silicon nitride 50 and the light emitting surface 70 can be further stabilized. Hence the average lifetime can be increased.

In the second embodiment, both the silicon nitride 50 and the active layer 18 have an interface containing nitrogen, which has few dangling bonds, allowing reduction of the density of nonradiative recombination centers. Hence the positive feedback chain of optical absorption and temperature increase is suppressed, and the decreased output due to COD (catastrophic optical damage) can be prevented.

Dielectrics such as silicon nitride and oxides have dielectric polarization near the light beam emission region. On the other hand, silicone-based materials, for example, used in the process of manufacturing a semiconductor laser device may be decomposed and tend to produce products by chemical reactions involving the light beam and heat. The produced silicon oxides, for example, tend to be deposited on the dielectric surface having dielectric polarization near the light beam emission region. The deposits vary the reflectance and disturb the FFP (far field pattern), causing characteristics change such as the decrease of optical output.

Here, the light beam spreads vertically and horizontally. In FIG. 4*a* the vertical spread angle Fv is 15 to 30 degrees, for example. If the sum of the thicknesses of the active layer 18, and the p-type GaN optical guide layer 20 and the n-type GaN optical guide layer 16 sandwiching the active layer 18, is in the range of 100 to 200 nm, then the optical density can be decreased with the distance from the light emitting surface 70 because the light beam 80 travels while spreading vertically. Furthermore, the temperature becomes higher as the distance to the light emitting surface 70 decreases. Hence, as the silicon nitride 50 becomes thicker, chemical reactions are suppressed, and deposition can be prevented. Thus the second embodiment, in which the silicon nitride 50 thicker than one wavelength is in contact with the light emitting surface 70, provides a semiconductor laser device with improved reliability.

The case of the six-layered reflecting film has been described. However, the invention is not limited thereto. A higher reflectance can be obtained by using a multilayered dielectric. The reflectance can be controlled in the range of 0 to 18% by setting the thickness of the first silicon nitride 50 to $\lambda_{g1}$ or more and adjusting the thickness of the silicon dioxide 52 of the second layer in the range of more than zero and less than $\lambda_{g2}/4$. Furthermore, the reflectance can be controlled in the range of 7 to 18% by using a reflecting layer consisting only of the silicon nitride 50 and setting the thickness T1 to $\lambda_{g1}$ or more. A semiconductor layer device having such a low reflective layer is useful for the next-generation DVD applications for rewriting purposes.

The reliability of the semiconductor laser device according to the first embodiment can be further improved by using the configuration of the first film 55 in the second embodiment. That is, the thickness of the silicon nitride 50 in contact with the light emitting surface 70 is set to not less than the in-medium wavelength, and hence the variation of operating current is suppressed, which facilitates. Increasing the average lifetime.

According to the configuration of FIG. 7, if the thickness T6 of the silicon dioxide in the sixth layer is varied in the range of 450 to 480 nm, the reflectance can be controlled in the range of 40 to 60%. If the thickness T6 is varied in the range of 455 to 475 mm the reflectance can be controlled in the range of 45 to 55%. Furthermore, according to the configuration of FIG. 8, if the thickness T6 of the silicon dioxide in the sixth layer is varied in the range of 575 to 610 nm, the reflectance can be controlled in the range of 40 to 540%. This facilitates reduction of heat generation per unit area and allows downsizing of the chip while maintaining reliability. That is, it is possible to provide a semiconductor laser device meeting the requirements for the next-generation DVD characteristics and being suitable for mass production.

The embodiments of the invention have been described with reference to the drawings. However, the invention is not limited to these embodiments. The material, shape, size, and placement of the epitaxially grown semiconductor laminated body, substrate, dielectric, insulating film, waveguide, electrode, and optical resonator can be modified by those skilled in the art, and such modifications are also encompassed within the scope of the invention without departing from the spirit from the invention.

The invention claimed is:

1. A semiconductor laser device comprising:

a substrate of a first conductivity type;

a laminated body of a nitride semiconductor provided on the substrate and including at least an active layer, a cladding layer of a second conductivity type having a ridge-shaped waveguide, a cladding layer of the first conductivity type provided between the substrate and the active layer;

a first film provided on one end surface of an optical resonator composed of the laminated body, the first film having a reflectance of 40% or more and 60% or less; and a second film provided on the other end surface of the optical resonator and having a higher reflectance than the first film, the optical resonator having a length of 400 μm or less, the one end surface serving as a light emitting surface, the cladding layer of the first conductivity type is made of $Al_xGa_{1-x}N$ ($0 \leqq x \leqq 0.1$), the cladding layer of the second conductivity type is made of $Al_yGa_{1-y}N$ ($0 \leqq y \leqq 0.1$), and the active layer has a single or multiple quantum well structure composed of a well layer of $In_wGa_{1-w}N$ ($0.06 \leqq w \leqq 0.2$) and a barrier layer of $In_bGa_{1-b}N$ ($0.01 \leqq b \leqq 0.05$).

2. The semiconductor laser device according to claim 1, wherein the reflectance of the first film is 45% or more and 55% or less.

3. The semiconductor laser device according to claim 1, wherein the first and second films have a Bragg reflector including two types of dielectrics having different refractive indices.

4. The semiconductor laser device according to claim 1, wherein the laminated body further includes an overflow prevention layer provided between the active layer and the cladding layer of the second conductivity type, and the overflow prevention layer is made of $Al_zGa_{1-z}N$ ($y<z$).

5. A semiconductor laser device comprising:

a substrate of a first conductivity type;

a laminated body of a nitride semiconductor provided on the substrate and including at least an active layer and a cladding layer, the cladding layer being of a second conductivity type and having a ridge-shaped waveguide; and a first film including a first dielectric of silicon nitride provided in direct contact with a light emitting surface of an optical resonator composed of the laminated body, the optical resonator having a length of 400 μm or less, the silicon nitride having a thickness of not less than in-medium wavelength, and the first film having a reflectance of 40% or more and 60% or less at a wavelength of light emitted from the active layer.

6. The semiconductor laser device according to claim 5, wherein the reflectance of the first film is 45% or more and 55% or less.

7. The semiconductor laser device according to claim 5, wherein the first film further includes a second dielectric provided on the silicon nitride and having a refractive index different from that of the silicon nitride.

8. The semiconductor laser device according to claim 7, wherein the first film further includes an a third dielectric provided on the second dielectric and having a refractive index different from that of the second dielectric, and the second and third dielectric constitute a first Bragg reflector.

9. The semiconductor laser device according to claim 8, wherein the second and third dielectric each have a thickness of a quarter of the associated in-medium wavelength.

10. The semiconductor laser device according to claim 9, wherein the first film further includes a second Bragg reflector provided on the first Bragg reflector and having the same material and thickness as the first Bragg reflector, and a fourth dielectric provided on the second Bragg reflector and made of the same material as the second dielectric, and the sum of the thicknesses of the silicon nitride, the first Bragg reflector, the second Bragg reflector, and the fourth dielectric divided by the associated in-medium wavelength is greater than 2.

11. The semiconductor laser device according to claim 7, wherein the refractive index of the second dielectric is lower than the refractive index of the silicon nitride.

12. The semiconductor laser device according to claim 5, wherein the laminated body further includes a cladding layer of the first conductivity type provided between the substrate and the active layer, the cladding layer of the first conductivity type is made of $Al_xGa_{1-x}N$ ($0 \leqq x \leqq 0.1$), the cladding layer of the second conductivity type is made of $Al_yGa_{1-y}N$ ($0 \leqq y \leqq 0.16$), and the active layer has a single or multiple quantum well structure composed of a well layer of $In_wGa_{1-w}N$ ($0.06 \leqq w \leqq 0.2$) and a barrier layer of $In_bGa_{1-b}N$ ($0.01 \leqq b \leqq 05$).

13. The semiconductor laser device according to claim 12, wherein the laminated body further includes an overflow prevention layer provided between the active layer and the cladding layer of the second conductivity type, and the overflow prevention layer is made of $Al_zGa_{1-z}N$ ($y<z$).

* * * * *